United States Patent
Kinouchi et al.

[11] Patent Number: 6,069,575
[45] Date of Patent: May 30, 2000

[54] VARIABLE LENGTH CODE DECODER

[75] Inventors: Shigenori Kinouchi; Akira Sawada, both of Tokyo, Japan

[73] Assignee: NEC Corporation, Tokyo, Japan

[21] Appl. No.: 09/092,943

[22] Filed: Jun. 8, 1998

[30] Foreign Application Priority Data

Jun. 9, 1997 [JP] Japan .................................. 9-151263

[51] Int. Cl.[7] .................................................. H03M 7/40
[52] U.S. Cl. .............................................. 341/67; 341/65
[58] Field of Search ................... 341/67, 63, 65, 341/107

[56] References Cited

U.S. PATENT DOCUMENTS

| | | | |
|---|---|---|---|
| 4,922,510 | 5/1990 | Brusewitz | 375/122 |
| 5,369,405 | 11/1994 | Choi et al. | 341/63 |
| 5,400,075 | 3/1995 | Savatier | 348/384 |
| 5,617,089 | 4/1997 | Kinouchi et al. | 341/65 |
| 5,621,466 | 4/1997 | Miyane et al. | 348/405 |
| 5,663,726 | 9/1997 | Bakhmutsky | 341/67 |
| 5,914,680 | 6/1999 | Murashita | 341/107 |

FOREIGN PATENT DOCUMENTS

| | | |
|---|---|---|
| 62-66720 | 3/1987 | Japan . |
| 7-111461 | 4/1995 | Japan . |

*Primary Examiner*—Michael Tokar
*Assistant Examiner*—Peguy JeanPierre
*Attorney, Agent, or Firm*—Sughrue, Mion, Zinn, Macpeak & Seas, PLLC

[57] ABSTRACT

To provide a VLC decoder having a decoding speed sufficiently high to be applicable for decoding MPEG 2 data, and having an appropriate circuit size to be integrated on an IC chip, a VLC decoder comprises: a first decode table (102) implemented with logic circuits for decoding a "zero-run code" at one clock; a second decode table (104) implemented on a memory device for decoding other VLC making use of a tree searching technique; a switching means (103, 105, 108) for switching from the first decode table (102) to the second decode table (104) when EOB code is decoded and switching from the second decode table (104) to the first decode table (102) when the "zero-run code" begins.

6 Claims, 17 Drawing Sheets

FIG. 2

| ADDRESS<br>9 8 7 6 5 4 3 2 1 0 | DATA<br>9 8 7 6 5 4 3 2 1 0 (highest2 bits = flag data) |
|---|---|
| 0 0 0 0 0 0 1 0 1 0 | 0 1 word 'A',( code length 4 ) |
| 0 0 0 0 0 0 1 0 1 1 | 0 0 0 0 0 0 1 0 0 0 |
| 0 0 0 0 0 1 1 0 0 0 | 0 0 0 0 0 1 0 0 0 0 |
| 0 0 0 0 1 0 x x 1 0 | 0 1 word 'C',( code length 10 ) |
| ⋮ | ⋮ |
| 0 x x x x x x x x x | 1  DDD data, ( code length ) |
| 1 M M M M M M M M M | 1 N N N N N N N N N |
| ⋮ | ⋮ |
| 1 P P P P P P P P P | 1 Q Q Q Q Q Q Q Q Q |

FIG.4

| ADDRESS<br>8 7 6 5 4 3 2 1 0 | DATA<br>8 7 6 5 4 3 2 1 0  ( highest bit = flag data ) |
|---|---|
| 0 0 0 0 0 1 0 1 0 | 1 word 'A',( code length 4 ) |
| 0 0 0 0 0 1 0 1 1 | 0 0 0 0 0 1 0 0 0 |
| 0 0 0 0 1 1 0 0 0 | 0 0 0 0 1 0 0 0 0 |
| 0 0 0 1 0 x x 1 0 | 1 word 'C',( code length 10 ) |
| ⋮ | ⋮ |
| S S S S S T T T T | U U U U U U U U U |
| ⋮ | ⋮ |

FIG. 6

| CLASS | DATA | | BIT LENGTH |
|---|---|---|---|
| MACRO-BLOCK LAYER | M B E | Macroblock Escape | 11 |
| | M B A I | Macroblock Address Increment | 1-11 |
| | M B T | Macroblock Type | 1-9 |
| | S T W C | Spatial Temporal Weight Code | 2 |
| | F r M T | Frame Motion Type | 2 |
| | F i M T | Field Motion Type | 2 |
| | D T | DCT Type | 1 |
| | Q S C | Quantizer Scale Code | 5 |
| | M V F S | Motion Vertical Field Select | 1 |
| | M H C | Motion Horizontal Code | 1-11 |
| | M H r | Motion Horizontal r | 1-8 |
| | D H | DMV Horizontal | 1-2 |
| | M V C | Motion Vertical Code | 1-11 |
| | M V r | Motion Vertical r | 1-8 |
| | D V | DMV Vertical | 1-2 |
| | C B P 4 2 0 | Coded Block Pattern 420 | 3-9 |
| | C B P 1 | Coded Block Pattern 1 | 2 |
| | C B P 2 | Coded Block Pattern 2 | 6 |
| BLOCK LAYER | D D S L | DCT DC Size Luminance | 2-9 |
| | D D S C | DCT DC Size Chrominance | 2-10 |
| | D D D | DCT DC Differential | 1-11 |
| | F D C | First DCT Coefficients | 2-24 |
| | S D C | Subsequent DCT Coefficients | 2-24 |
| | E O B | End of Block | 2 |

FIG. 7

| Variable length code (NOTE1) | run | level |
|---|---|---|
| 10 (NOTE2) | End of Block | |
| 1s (NOTE3) | 0 | 1 |
| 11s (NOTE4) | 0 | 1 |
| 011s | 1 | 1 |
| 0100s | 0 | 2 |
| 0101s | 2 | 1 |
| 0010 1s | 0 | 3 |
| 0011 1s | 3 | 1 |
| 0011 0s | 4 | 1 |
| 0001 10s | 1 | 2 |
| 0001 11s | 5 | 1 |
| 0001 01s | 6 | 1 |
| 0001 00s | 7 | 1 |
| 0000 110s | 0 | 4 |
| 0000 100s | 2 | 2 |
| 0000 111s | 8 | 1 |
| 0000 101s | 9 | 1 |
| 0000 01 | Escape | |
| 0010 0110s | 0 | 5 |
| 0010 0001s | 0 | 6 |
| 0010 0101s | 1 | 3 |
| 0010 0100s | 3 | 2 |
| 0010 0111s | 10 | 1 |
| 0010 0011s | 11 | 1 |
| 0010 0010s | 12 | 1 |
| 0010 0000s | 13 | 1 |
| 0000 0010 10s | 0 | 7 |
| 0000 0011 00s | 1 | 4 |
| 0000 0010 11s | 2 | 3 |
| 0000 0011 11s | 4 | 2 |
| 0000 0010 01s | 5 | 2 |
| 0000 0011 10s | 14 | 1 |
| 0000 0011 01s | 15 | 1 |
| 0000 0010 00s | 16 | 1 |

NOTE1-The last bit 's' denotes the sign of the level, '0' for positive '1' for negative
NOTE2-"End of Block" shall not be only code of the block
NOTE3-This code shall be used for the first (DC) coefficient in the block
NOTE4-This code shall be used for all other coefficients

FIG. 8

| CLASS | DATA | | BIT LENGTH |
|---|---|---|---|
| BLOCK LAYER | D D S L | DCT DC Size Luminance | 2 - 7 |
| | D D S C | DCT DC Size Chrominance | 2 - 8 |
| | D D C D | DCT DC Differential | 1 - 8 |
| | D C F | DCT Coefficient First | 2 - 28 |
| | D C N | DCT Coefficient Next | 3 - 28 |
| | E O B | End of Block | 2 |

FIG.11 PRIOR ART

| INPUT | | | | | | | | | | | | | | | | OUTPUT |
|---|---|---|---|---|---|---|---|---|---|---|---|---|---|---|---|---|
| 15 | 14 | 13 | 12 | 11 | 10 | 9 | 8 | 7 | 6 | 5 | 4 | 3 | 2 | 1 | 0 | |
| 0 | 1 | 0 | 1 | x | x | x | x | x | x | x | x | x | x | x | x | word 'A', code length = 4 |
| 0 | 1 | 1 | 0 | 1 | 0 | 1 | x | x | x | x | x | x | x | x | x | word 'B', code length = 7 |
| --- | --- | --- | --- | --- | --- | --- | --- | --- | --- | --- | --- | --- | --- | --- | --- | --- |

FIG. 13 PRIOR ART

| ADDRESS<br>8 7 6 5 4 3 2 1 0 | MEMORIZED DATA<br>QF  7 6 5 4 3 2 1 0       ( QF : FLAG DATA ) |
|---|---|
| 0 0 0 0 0 1 0 1 0 | 1 word 'A', code length 4 |

| 8 7 6 5 4 3 2 1 0 | QF  7 6 5 4 3 2 1 0       ( QF : FLAG DATA ) |
|---|---|
| 0 0 0 0 0 1 0 1 1 | 0    0 0 0 0 1 0 0 0 |
| 0 0 0 0 1 1 0 0 0 | 0    0 0 0 1 0 0 0 0 |
| 0 0 0 1 0 x x 1 0 | 1 word 'C', code length 10 |

FIG. 15 PRIOR ART

| INPUT | | | | | | | | | | | | | | | | OUTPUT | FLAG |
|15|14|13|12|11|10|9|8|7|6|5|4|3|2|1|0|---|---|
|0|1|0|1|x|x|x|x|x|x|x|x|x|x|x|x|word 'A', code length 4|0|
|0|1|1|0|1|0|1|x|x|x|x|x|x|x|x|x|word 'B', code length 7|0|
|0|1|1|1|0|0|1|0|0|1|0|1|1|x|x|x|word 'C', code length 13|0|
|1|0|1|1|1|1|0|0|0|0|x|x|x|x|x|x|word 'D', code length 10|0|
|---|---|---|---|---|---|---|---|---|---|---|---|---|---|---|---|---|---|
| When address data length < code length | | | | | | | | | | | | | | | | code length 0 | 1 |

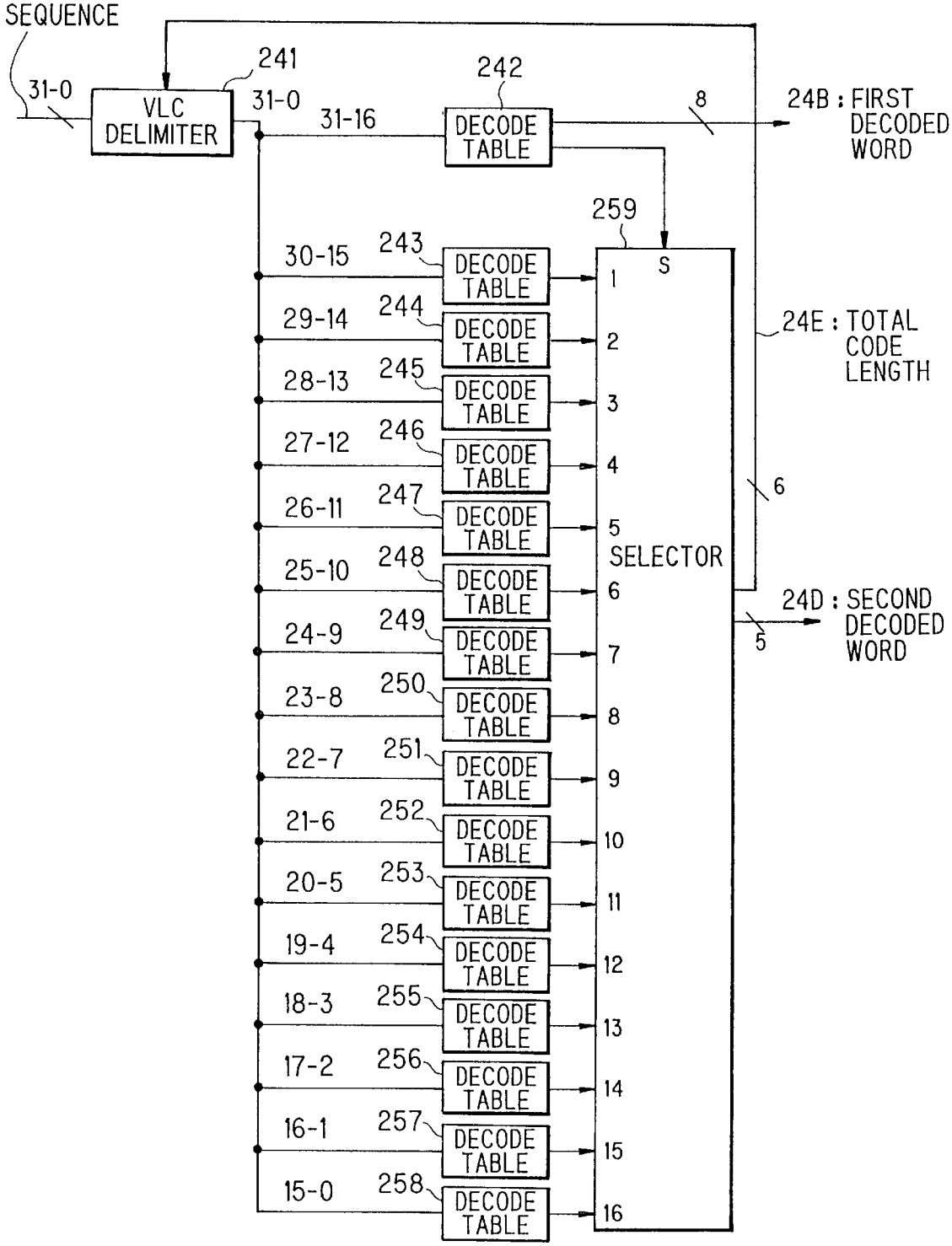

FIG. 17 PRIOR ART

DECODE TABLE 242

| INPUT | | | | | | | | | | | | | | | | OUTPUT |
|15|14|13|12|11|10|9|8|7|6|5|4|3|2|1|0| |
|---|---|---|---|---|---|---|---|---|---|---|---|---|---|---|---|---|
| 0 | 1 | 0 | 1 | x | x | x | x | x | x | x | x | x | x | x | x | word 'A', code length = 4 |
| 0 | 1 | 1 | 0 | 1 | 0 | 1 | x | x | x | x | x | x | x | x | x | word 'B', code length = 7 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |

DECODE TABLE 243

| INPUT | | | | | | | | | | | | | | | | OUTPUT |
|15|14|13|12|11|10|9|8|7|6|5|4|3|2|1|0| |
|---|---|---|---|---|---|---|---|---|---|---|---|---|---|---|---|---|
| 0 | 1 | 0 | 1 | x | x | x | x | x | x | x | x | x | x | x | x | word 'A', total length = 5 |
| 0 | 1 | 1 | 0 | 1 | 0 | 1 | x | x | x | x | x | x | x | x | x | word 'B', total length = 8 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |

DECODE TABLE 246

| INPUT | | | | | | | | | | | | | | | | OUTPUT |
|15|14|13|12|11|10|9|8|7|6|5|4|3|2|1|0| |
|---|---|---|---|---|---|---|---|---|---|---|---|---|---|---|---|---|
| 0 | 1 | 0 | 1 | x | x | x | x | x | x | x | x | x | x | x | x | word 'A', total length = 8 |
| 0 | 1 | 1 | 0 | 1 | 0 | 1 | x | x | x | x | x | x | x | x | x | word 'B', total length = 11 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |

DECODE TABLE 253

| INPUT | | | | | | | | | | | | | | | | OUTPUT |
|15|14|13|12|11|10|9|8|7|6|5|4|3|2|1|0| |
|---|---|---|---|---|---|---|---|---|---|---|---|---|---|---|---|---|
| 0 | 1 | 0 | 1 | x | x | x | x | x | x | x | x | x | x | x | x | word 'A', total length = 15 |
| 0 | 1 | 1 | 0 | 1 | 0 | 1 | x | x | x | x | x | x | x | x | x | word 'B', total length = 18 |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |

VARIABLE LENGTH CODE DECODER

BACKGROUND OF THE INVENTION

The present invention relates to a variable length code (hereafter abbreviated as VLC) decoder which can decode the VLC with a sufficient speed and, at the same time, with an appropriate circuit size to be integrated on an IC chip.

In conventional VLC decoders, there are a type having a decode table implemented with random logic circuits such as AND/OR gates, and a type having a decode table implemented on a memory device. Hereafter, the former type will be called a fixed hard type and the latter type, a programmed type.

In the programmed type VLC decoders, there is a decoder which decodes the VLC code by code, a decoder which decodes two codes at once by performing two-stage retrieval of the decode table and determining the beginning bit of a next VLC sequence from addition of code lengths of the two decoded codes, or a circuit which uses a plurality of decode tables for realizing a high-speed decoding, whereof an example is disclosed in a U.S. Pat. No. 5,617,089.

FIG. 9 is a block diagram illustrating a conventional example of the above fixed hard type VLC decoder making use of a decode table implemented with random logic circuits. In the example of FIG. 9, assuming the maximum code length of the VLC as 16 bits, a bit sequence of 16 bits is expressed as 15-0, a numeral 15 representing a beginning bit thereof.

The VLC decoder of FIG. 9 comprises a VLC delimiter 201 for determining beginning of a next bit sequence of the VLC and a random logic decode table 202 consisting of random logic circuits.

The random logic decode table 202 is composed of logic circuits such as AND/OR gates so as to output a decoded word 20B of 8 bits and a code length data 20C of 5 bits which are corresponding to a VLC included in beginning part of an input bit sequence of 16 bits. For example, when a VLC of a decoded word 'A' is '0101' and a VLC of a decoded word 'B' is '0110 101', the random logic decode table 202 outputs a decoded word 'A' and a code length of 4 when a 16 bit sequence beginning with '0101 . . . ' is supplied, and outputs a decoded word 'B' and a code length of 7 when a 16 bit sequence beginning with '0110 101 . . . ' is supplied.

Initial value of delimiting point of the VLC delimiter 201 is set just before the beginning bit.

Suppose a VLC bit sequence 20A of '0101 0110 1010 01 . . . ' is supplied to be decoded.

The delimiting point being set before the beginning bit, the VLC delimiter 201 sends first 16 bits of '0101 0110 1010 01 . . . ' of the VLC bit sequence 20A to the random logic decode table 202. The random logic table 202, which is designed to output the decoded word 20B of 'A' and the code length 20C of 4 to the input 16 bits of '0101 . . . ', outputs the decoded word 20B of 'A' and the code length 20C of 4. The code length 20C is fed back to the VLC delimiter 201. From the code length 20C of 4, the VLC delimiter 201 sets the delimiting point before the fifth bit of actually decoding VLC bit sequence 20A of '0101 0110 1010 01 . . . ', sends 16 bits of '0110 1010 01 . . . ' beginning with the fifth bit to the random logic decoder table 202, and shifts the VLC bit sequence 20A by 4 bits, rejecting the beginning 4 bits.

The random logic decode table 202, which is designed to output the decoded word 20B of 'B' and the code length 20C of 7 to the input 16 bits of '0110 101 . . . ', outputs the decoded word 20B of 'B' and the code length 20C of 7, which is fed back to the VLC delimiter 201. From the code length 20C of 7, the VLC delimiter 201 sets the delimiting point before the eighth bit of actually decoding VLC bit sequence 20A of '0110 1010 01 . . . ', sends 16 bits of '001 . . . ' beginning with the eighth bit thereof to the random logic decode table 202, and shifts the VLC bit sequence 20A by 7 bits, rejecting the former 7 bits.

By repeating above procedure, the VLC decoding is performed in the VLC decoder of FIG. 9.

FIG. 10 is a block diagram illustrating a conventional example of the programmed type VLC decoder which decodes the VLC code by code. In the example of FIG. 10, the maximum code length of the VLC is also assumed to be 16 bits and a bit sequence of 16 bits is expressed as 15-0, a numeral 15 representing a beginning bit thereof.

Similarly to the VLC decoder of FIG. 9, the VLC decoder of FIG. 10 comprises a VLC delimiter 201 for determining beginning of a next bit sequence of the VLC and a memory decode table 212.

FIG. 11 is a schematic diagram illustrating data prepared in the memory decode table 212. As illustrated in FIG. 11, when a bit sequence beginning with a VLC code is input as an address of the memory decode table 212, data registered in the address is output as the decoded word 20B and the code length 20C. For example, when a VLC of a decoded word 'A' is '0101' and a VLC of a decoded word 'B' is '0110 101', the memory decode table 212 outputs a decoded word 'A' and a code length of 4 when a 16 bit sequence beginning with '0101 . . . ' is supplied as the address, and outputs a decoded word 'B' and a code length of 7 when a 16 bit sequence beginning with '0110 101 . . . ' is supplied.

Initial value of delimiting point of the VLC delimiter 201 is set before the beginning bit.

Suppose a VLC bit sequence 20A of '0101 0110 1010 01 . . . ' is supplied to be decoded.

The delimiting point being set before the beginning bit, the VLC delimiter 201 sends first 16 bits of '0101 0110 1010 01 . . . ' of the VLC bit sequence 20A to the memory decode table 212. The memory decode table 212, wherein the decoded word 20B of 'A' and the code length 20C of 4 are registered in addresses beginning with '0101 . . . ', outputs the decoded word 20B of 'A' and the code length of 4. the code length 20C is fed back to the VLC delimiter 201. From the code length 20C of 4, the VLC delimiter 201 sets the delimiting point before the fifth bit of actually decoding VLC bit sequence 20A of '0101 0110 1010 01 . . . ', sends 16 bits of '0110 1010 01 . . . ' beginning with the fifth bit thereof to the memory decode table 212, and shifts the VLC bit sequence 20A by 4 bits, rejecting the beginning 4 bits.

The memory decode table 212, wherein the decoded word 20B of 'B' and the code length 20C of 7 are registered in addresses beginning with '0110 101 . . . ', outputs the decoded word 20B of 'B' and the code length 20C of 7, which is fed back to the VLC delimiter 201. From the code length 20C of 7, the VLC delimiter 201 sets the delimiting point before the eighth bit of actually decoding VLC bit sequence 20A of '0110 1010 01 . . . ', sends 16 bits of '001 . . . ' beginning with the eighth bit thereof to the memory decoder table 212, and shifts the VLC bit sequence 20A by 7 bits, rejecting the former 7 bits.

By repeating above procedure, the VLC decoding is performed in the VLC decoder of FIG. 10.

A concrete example of the VLC decoder of FIG. 10 is disclosed in a Japanese patent application laid open as a Provisional Publication No. 66720/'87, wherein the VLC delimiter 202 is realized with a data register, code registers, address selectors, a beginning bit register and a control circuit, and the memory decode table is realized with a ROM.

FIG. 12 is a block diagram illustrating another conventional example of the programed type VLC decoder for decoding the VLC code by code, wherein VLC decoding is performed by way of a memory decode table implemented with a reduced memory space.

The VLC decoder of FIG. 12 comprising;

a latch circuit 221, a selector 222 for selecting either lower three bits (A0) of eight bits output of the latch circuit 221 or second to fourth three bits (A1) of a VLC bit sequence 22A, according to a select signal 22E, a memory decode table 223 wherein a first bit of the VLC bit sequence 22A is input as a lowest bit (AL) of address data, three bits output of the selector 222 are input as second to fourth lower bits (AHL) of the address data, and upper five bits of the eight bits output of the latch circuit 221 are input as upper five bits (AHH) of the address data, and a VLC delimiter 224.

The latch circuit 221 latches eight bits (QD) output of the memory decode table 223 when logic of a flag 22D (QF) output from the memory table 223 is '0'.

The memory decode table 223 outputs the flag 22D of logic '1' when the output eight bits (QD) are indicating a decoded word 22B, while outputting the flag 22D of logic '0' when the eight bits (QD) are indicating pointer data.

FIG. 13 is a schematic diagram illustrating data prepared in the memory decode table 223 of FIG. 12.

Referring to FIGS. 12 and 13, decoding procedure of a VLC '0101' representing a decoded word 'A' and a VLC '1101 0001 01' representing a decoded word 'C' will be described by way of example. The maximum code length of the VLC is assumed to be 16 bits.

The VLC decoder of FIG. 12 can be controlled to analyze the VLC code bit by bit or four bits by four bits according to the select signal 22E. Here, the decoding procedure is described to be performed four bits by four bits.

A VLC bit sequence 22A of '0101 0110 1010 01 . . . ' is supplied to be decoded to the VLC delimiter 224. The VLC delimiter 224 detects the beginning bit of the VLC bit sequence 22A in the same way with the VLC delimiter 201 previously described, and outputs the VLC bit sequence 22A either bit by bit or four bits by four bits at every clock according to the select signal 22E. Here, the VLC delimiter outputs beginning four bits '0101' of the VLC bit sequence 22A.

Initially, the latch circuit 221 is reset and outputs eight bits of '0000 0000', whereof upper five bits are supplied to the memory decode table 223 as the upper five bits (AHH) of its address data. Lower three bits are supplied to the selector 222, which (A0) is not selected here, in this case.

The beginning bit of the four VLC bits output from the VLC delimiter 224 is supplied to the memory decode table 223 as the lowest bit (AL) of the address data. Second to fourth bits of the four VLC bits are supplied to the memory decode table 223 as second to fourth lower bits of the address data (AHL) selected by the selector 222.

Thus, address data '0000 0101 0' is supplied to the memory decode table 223.

In the address '0000 0101 0', the decoded word 22B of 'A' and the code length 22C of 4 are stored as shown in FIG. 13.

In the same way as this example, in every address composed of a pointer, which is fifth to ninth bits (5–8) of the nine bit (0–8) address, of '0000 0', and one of 1 to 4 bit codes of the VLC as lower four bits (0–3) thereof, the decoded word 22B and the code length 22C of each corresponding 1 to 4 bit code is stored together with a bit data (QF) '1' of the flag 22D, in the memory decode table 223 of FIG. 13, when it is prepared to be used for decoding four bits by four bits.

Returning to FIG. 12, supplied with the address '0000 0101 0', the memory decode table 223 outputs the decoded word 22B or 'A', the code length 22C of 4 and the flag 22D of '1'. With the flag 22D of '1', the latch circuit 221 is reset and the VLC delimiter 224 outputs begining four bits of the following VLC bit sequence 22A of '1101 0001 01 . . . ', detecting a four bit VLC is decoded, by the flag 22D of '1' and the code length 22C of 4.

Being reset by the flag 22D of '1', the latch circuit 221 outputs '0000 0000', whereof upper five bits are supplied as the upper address AHH of the memory decode table 223. As the lower address AHL and AL, the four VLC bits output from the VLC delimiter 224 are supplied in the same way as above described. Hence, an address '0000 0101 1' is input to the memory decode table 223.

In the address '0000 0101 1' of the memory decode table 223, pointer data (0–7) of '0000 1000' and flag data (QF) of '0' are stored and output. In the same way as this example, in the addresses having lower four bits which cannot identify any VLC code together with its pointer, namely, the upper five bits of the address, eight bit pointer data indicating a next pointer by its upper five bits is stored together with flag data (QF) of '0'.

By the flag 22D of '0', the output (QD) of the memory decode table 223 is known to be a pointer data, and analysis of the VLC code is continued with next four VLC bits supplied from the VLC delimiter 224.

The eight bit pointer data, that is, the output (QD) of the memory code table 223, is latched by the latch circuit 221. Upper five bits '0000 1' thereof are supplied to the memory decode table 223 as the upper address AHH. The next four VLC bits of '0001', that is, fifth to eighth bits of the actually decoding VLC bit sequence 22A of '1101 0001 01 . . . ', are supplied as the lower address AHL and AL. Thus, an address '0000 1100 0' is supplied to the memory decode table 223.

In the address '0000 1100 0', another eight bit (0–7) pointer data of '0001 0000' is stored with a flag data (QF) of '0' to be output. Therefore, the analysis of the VLC code is continued with third four VLC bits supplied from the VLC delimiter 224.

The pointer, that is, upper five bits '0001 0' of the eight bit pointer data, are supplied as the upper address AHH and the 9–12th bits of '01 . . . ' of the actually decoding VLC bit sequence 22A of '1101 00010 1 . . . ' are supplied as the lower address AHL and AL of the memory decode table 223, which gives an address '0001 0xx1' and the decoded word 22B of 'C' and the code length of 10 are output with the flag 22D of '1'. With the flag 22D of '1', the latch circuit 221 is reset to verb/'0000 000'/, and the VLC delimiter 224 delimits the VLC bit sequence 22A according to the code length 22D of 10.

Repeating above procedure, four bits by four bits, the VLC decoding is performed in the VLC decoder of FIG. 12.

When the decode procedure is performed four bits by four bits, upper five bits of the eight bit pointer data are used as the next pointer, lower three bits being ignored by the selector 222. This means that a nine bit address is represented by a pointer of five bits. However, the number of the data sets of lower four bits, for example, of the address data which cannot identify any VLC code together with a pointer, is limited within a certain number which is depending on each coding system of the VLC. Therefore, on condition that the pointer of every analyzing step of the four VLC bits can be represented by one different set of five bits, the memory space of the memory decode table 223 of the VLC decoder of FIG. 12 can be reduced, into $\frac{1}{2}^5$ in the example of FIG. 13, compared to the memory decode table 212 of FIG. 11.

When the pointer needs eight bits, for example, data in the memory decode table 223 may be prepared according to a decoding tree for analyzing the VLC bit by bit, making use of all of the eight bits of the pointer data (0–7) as the pointer. The selector 222 is controlled to select lower three bits (A0) of the output of the latch circuit 221, and the VLC delimiter 224 is controlled, by the select signal 22E, to output the VLC bit sequence 22A bit by bit at each clock.

In other words, when the pointer of substantially five bits is sufficient, the memory space of the memory decode table 223 can be still reduced into $\frac{1}{2}^3$, by performing the VLC analysis bit by bit, ignoring upper three bits of the address data of the memory decode table 223.

As above described, making use of a tree searching technique, memory space of the memory decode table can be reduced. However, it takes several clocks for decoding a VLC whereof the code length is longer than a searching unit.

FIG. 14 is a block diagram illustrating another conventional example of the programmed type VLC decoder for decoding the VLC by two codes at once.

Referring to FIG. 14, the VLC decoder comprises a first and a second VLC delimiter 231 and 232, a first and a second decode table 233 and 234 each for outputting a decoded word 23B or 23E of eight bits, a code length 23C or 23F of five bits, for example, and a flag 23D or 23G, a first and a second adder 235 and 236, and a pointer circuit 237.

Assuming the maximum code length of the VLC to be 16, a VLC bit sequence 23A or 32 bits (31-0; 32-th bit representing the beginning bit) are supplied at once to the VLC decoder of FIG. 14.

FIG. 15 is a schematic diagram illustrating an example of the first or the second decode table 231 or 232. The first and the second decode table 231 and 232 has similar configuration to the memory decode table 212 of FIG. 11. However, when a part of a VLC code is supplied as its address data, the first or the second decode table 231 or 232 outputs the code length 23C or 23F of 0 and a flag 23D or 23F of of '1', which becomes '0' when the address data includes full bits of any VLC.

In the example of FIG. 15, a VLC code '0101' is assigned to a decoded word 'A', '0110 01' is assigned to a decoded word 'B', '0111 0101 001' is assigned to a decoded word 'C', and '1011 0100 00' is assigned to a decoded word 'D'. Therefore, when an address data beginning with '0101 . . . ' is input, the decoded word 'A', the code length 4 and the flag '0' are output. In the same way, to an address data '0110 101 . . . ', the decoded word 'B', the code length 7 and the flag '0' are output; to an address data '0111 0010 1100 1', the decoded word 'C', the code length 13 and the flag '0' are output; and to an address '1011 0100 00 . . . ', the decoded word 'D', the code length 10 and the flag '0' are output.

When a part '1011 0100' (eight bits) of the VLC code '1011 0100 00' (code length 10) of the decoded word 'D' is input, for example, the first or the second decode table 233 or 234 outputs a code length 0 and a flag '1', as follows, for example. When an address data shorter than 16 bits is given, the first or the second decode table 233 or 234 is accessed by supplementing lower bits with necessary number of '0', and when the address data length is shorter than the code length stored in the address, the code length of '0' and the flag '1' are output ignoring the obtained decoded word, otherwise outputting the obtained decoded word and the code length with the flag of '0'.

Now, operation of the VLC decoder of FIG. 14 is described.

Initially, output of the pointer circuit 237 is set to '0' and the first VLC delimiter 231 sets the delimiting point at the beginning bit of the VLC bit sequence 23A of 32 bits.

When a VLC bit sequence 23A of '0101 0110 1010 1110 0101 1001 1011 0100 0001 1010 1 . . . ' is to be decoded, it is supplied to the first VLC delimiter 231. The first VLC delimiter 231, wherein the delimiting point is set at the beginning bit, outputs the first 32 bits '0101 0110 1010 1110 0101 1001 1011 0100' of the VLC bit sequence 23A, which (the first 32 bits) are also supplied to the second VLC delimiter 232, and upper 16 bits thereof, that is, '0101 0110 1010 1110' are supplied to the first decode table 233.

The first decode table 233, wherein data of the decoded word of 'A', the code length of 4 and a flag '0' are stored in the addresses beginning with '0101', outputs the first decoded word 23B of 'A', the code length 23C of 4 and a flag 23D of '0'. The code length 23C of 4 is sent to the second VLC delimiter 232 and the first adder 235. By the code length 23C of 4, the second VLC delimiter 232 delimits the first 32 bits between the fourth and the fifth bit thereof, and 16 bits '0110 1010 1110 0101' beginning with the fifth bit of the first 32 bits are supplied to the second decode table 234.

The second decode table 234, wherein data of the decoded word of 'B', the code length of 7 and a flag '0' are stored in the addresses beginning with '0110 101 . . .', outputs the second decoded word 23E of 'B', the code length 23F of 7 and the flag 23G of '0'. Th code length 23F of 7 is sent to the first adder 235.

The first adder 235 adds the code length 23F of 7 to the code length 23C of 4 (corresponding to the decoded word 'A'). Output 4+7=11 of the first adder 235 is sent to the second adder 236 and added to output of the pointer circuit 237. The output of the pointer circuit 237 being initialized to be 0, here, 11+0=11 is output from the second adder 236, which is supplied to the first VLC delimiter 231 through the pointer circuit 237. With the output of 11 of the pointer circuit 237, the beginning bit of the next VLC code is detected to be the 12th bit of the first 32 bits by the first VLC delimiter 231. Hence, 16 bits '0111 0010 1100 1101' beginning with the 12th bit of the first 32 bits are supplied to the first decode table 233, and 21 bits from 12th to 32th bits '0111 0010 1100 1101 1010 0' of the first 32 bits are sent to the second VLC delimiter 232.

The first decode table 233, wherein the decoded word 'C', the code length 13 and the flag '0' are stored in the addresses '0111 0010 1100 1 . . . ', outputs the first decoded word 23B of 'C', the code length 23C of 13 and the flag 23D of '0'. The code length 23C of 13 is sent to the second VLC delimiter 232 and the first adder 235. By the code length 23C of 13, the second VLC delimiter 232 delimits the second 21 bits between the 13th and 14th bit thereof, and 8 bits '1011 0100' beginnings with the 14th bit of the second 21 bits are supplied to the second decode table 234. The second decode table 234, which is configured to output the code length 23F of 0 and the flag 23G of '1' when address data length is shorter than the code length, sends the code length 23F of 0 to the first adder 235 and the flag 23G of '1' to the first VLC delimiter 231.

The first adder 235 adds the code length 23F of 0 to the code length 13 corresponding to the decoded word 'C' and sends 13+0=13 to the second adder 236. The second adder 236 adds 13 output from the first adder 235 to the output of 11 of the pointer circuit 237, which (13+11=24) is sent to the pointer circuit 237 and supplied to the first VLC delimiter 231. With the revised output of the pointer circuit 237 of 24, the first VLC delimiter 231 detects that a next VLC code begins from 25th bit of the VLC bit sequence 23A of '0101 0110 1010 1110 0101 1001 1011 0100 0001 1010 1 . . . '.

The flag 23G of '1' is also sent to the first VLC delimiter 231, indicating that the 8 bits supplied to second decode table 234 is not sufficient to be decoded. Therefore, the first VLC delimiter 231 outputs next 32 bits '1011 0100 0001 1010 1 . . . ' beginning with the 25th bits of the VLC bit sequence 23A. The output of the second decode table 234 is ignored when the flag 23G of '1' is output.

By repeating above procedure, the VLC decoding is performed by the VLC decoder of FIG. 14.

FIG. 16 is a block diagram illustrating another conventional example of the programmed type VLC decoder for decoding two codes at once, such as disclosed in the previously mentioned U.S. Pat. No. 5,617,089, In FIG. 16, the maximum code length of the VLC is assumed also to be 16 bits.

The VLC decoder of FIG. 16 comprises;

a VLC delimiter 241, a first to 17th decode table 242 to 258, whereof each i-th (i=1, 2, . . . , 17) is supplied with 16 bits beginning with i-th bit of a VLC bit sequence 24A after delimited by the VLC delimiter 241, and a selector 259 for selecting output data of one of the second to the 17th decode table 243 to 258 according to a code length 24C obtained from the first decode table 242.

FIG. 17 is a schematic diagram illustrating configuration of the first to the 17th decode table 242 to 258. The first decode table 242 has substantially the same configuration with the memory decode table 212 of FIG. 11, and the second to the 17th decode table 243 to 258 have similar configuration to the first decode table 242.

The only difference of the second to the 17th decode table to the first decode table 242 is that a total code length is stored in place of the code length of each address of the first decode table 242, said total code length indicating (Total code length)=(Code length)+(Order number of each decode table)−1.

For example, when a VLC code '0101' is assigned to a decoded word 'A', the decoded word of 'A' and the code length of 4 are stored in the addresses beginning with '0101 . . . ' of the first decode table 242. In the same addresses, the decoded word of 'A' and the total code length of 5 are stored in the second decode table 243, and the decoded word of 'A' and the total code length of 4+i−1 are stored in the i-th decode table.

Now, operation of the VLC decoder of FIG. 17 is described.

When the delimiting point is set at the beginning, a VLC bit sequence 24A '0101 0110 1010 0100 1 . . . ' supplied to the VLC delimiter 241 is output as it is, whereof 16 bits '0101 0110 1010 0100' beginning from the first bit (31–16) are supplied to the first decode table 242, and each 16 bits (30–15), (29–14), . . . , (15–0), beginning from the second, third, . . . , 17th bit, are supplied to each of the second to the 17th decode table 243 to 258, respectively, as illustrated in FIG. 17.

The first decode table 242, wherein the decoded word 'A' and the code length 4 are stored in the addresses '0101 . . . ', outputs the first decoded word 24B of 'A' and the code length 24C of 4. Each of the second to the 17th decode table 243 to 258 outputs some data stored in the address supplied thereto.

However, the selector 259 selects data output from the (i+1)-th decode table when the code length 24C output from the first decode table 242 is i. Here, in this case, the code length is 4. Therefore, the outputs of the fifth decode table 246 are selected.

The fifth decode table 246, wherein 16 bits (27–12) beginning from the fifth bit of the VLC bit sequence, that is, '0110 1010 0100 1 . . . ', are supplied and the decoded word 'B' and the total code length 11 are stored in the addresses '0110 101 . . . ', outputs the second decoded word 24D of 'B' and the total code length 24E of 11.

Thus two codes are decoded at once.

The total code length 24E of 11, which indicating a sum of the code length corresponding to the decoded word 'A' and that corresponding to the decoded word 'B', is fed back to the VLC delimiter 241 to be used for delimiting next 32 bits of the VLC bit sequence 24A. In this case, the VLC decoder 241 outputs the next 32 bits '0010 01 . . . ' beginning from the 12th bit of the VLC bit sequence 24A.

By repeating the above procedure, the VLC decoder of FIG. 17 performs the VLC decoding two codes by two codes.

FIG. 18 is a block diagram illustrating still another example of a conventional VLC decoder to be applied for decoding so called B2-code.

The VLC decoder of FIG. 18 comprises a bit shifter 261 for delimiting a VLC bit sequence 26A of the B2-code system, by shifting according to a shift number 26I, a code length decoder 262 for obtaining the code length 26D from continuation bits included in the B2-codes, a lookup table 263 for outputting decoded data 26E, a zero-run flag 26F, an EOB flag 26G and an EOB0/EOB1 flag 26H by decoding the B2-codes from information bits included in the B2-codes and the code length 26D.

According to the B2-code system, a maximum code length is defined to be 18, for example, and composed of a pair of continuation bit and an information bit when the code length is not 18 bits. A B2-code ends at an information bit following a continuation bit of '0', or 18th bit from the beginning. Therefore, the 17th bit is used as the ninth information bit when the code length is 18.

Making use of this characteristic of the B2-code system, 18 bits of the VLC bit sequence 26A delimited by the bit shifters 261 is divided into 10 information bits 26B and 8 continuation bits 26C. From position of '0' bit in the 8 continuation bits, or the fact there is no '0' bit, the code length 26D is decoded by the code length decoder 262. The lookup table 263 decodes the 10 information bits 26B instead of 18 bits of the possible VLC code length and outputs the decoded data 26E, the zero-run flag 26F, the EOB flag 26G and the EOB0/EOB1 flag 26H referring to the code length 26D.

The code length 26D is accumulated by the latched circuit 265 and the adder 264 on the shift number 26I and used by the bit shifter 261 for delimiting the VLC bit sequence 26A.

Heretofore, some examples of the conventional VLC decoders are described. However there are merits and demerits in these conventional VLC decoders.

The fixed hard type VLC decoder having a decode table realized with random logic circuits, such as described in connection with FIG. 9, every VLC code can be decoded by one clock. However, it can not be used except for decoding the VLC encoded according to a specific VLC coding system, without re-designing the decode table, that is, the hardware itself.

As to the programmed type VLC decoder for decoding code by code, such as described in connection with FIG. 10, it can be adapted to various VLC coding systems by re-writing data of the memory decode table. However, the memory decode table needs a large memory space, a memory space of 64K words, for example, when the maximum code length of the VLC is 16 bits, which is difficult to be integrated on an IC chip.

In the programmed type VLC decoder such as described in connection with FIG. 12 for analyzing the VLC code bit by bit or four bits by four bits making use of the tree searching technique, the memory space of the memory decode table can be reduced. However, it takes several clocks for decoding a VLC. Therefore, sufficient decoding speed cannot be obtained, especially for decoding compressed video data such as MPEG (Moving Picture Experts Group) data which must be described in real-time.

For improving the decoding speed, the VLC decoder for decoding two codes at once is somewhat effective. However, the circuit configuration such as described in connection with FIG. 14 needs a long path starting from the first VLC delimiter 231 and returning there through the first code table 233, the second delimiter 232, the second decode table 234, the first adder 235, the second adder 236 and the pointer circuit 237. Therefore, the clock frequency is limited within a value, and doubled memory space is needed for two decode tables.

The VLC decoder of FIG. 17 has no problem of the long path. However, enormous memory space is needed for 17 decode tables.

The VLC decoder of FIG. 18, a high speed decoding may be performed with a comparatively small memory space by extracting the information bits from the VLC code. However, it cannot be applied but to the VLC code according to a special coding system such as the B2-code.

SUMMARY OF THE INVENTION

Therefore, a primary object of the present invention is to provide a VLC decoder having a decoding speed sufficiently high to be applicable for decoding compressed video data, for example, and, at the same time, having an appropriate circuit size to be integrated on an IC chip.

In order to achieve the object, commonly and mainly used standardized VLC, such as so called the "zero-run code", is decoded making use of a random logic decode table, and other VLC depending on each coding system is decoded by way of a memory decode table making use of the tree searching technique.

A variable length code decoder according to an embodiment of the invention comprises:

a first decode table implemented with logic circuits for decoding each of variable length codes encoded according to a first coding system at one clock;

a second decode table implemented on a memory device for decoding variable length codes encoded according to other coding systems than the first coding system making use of a tree searching technique;

a first switching means for switching decoding procedure from the first decode table into the second decode table when a first specific code is decoded by way of the first decode table, said first specific code indicating an end of a sequence of the variable length codes according to the first coding system; and a second switching means for switching the decoding procedure from the second decode table into the first decode table when a second specific code is decoded by way of the second decode table, said second specific code indicating that a sequence of the variable length codes according to the first coding system is following.

As to the first coding system, the zero-run coding system, which is standardized for coding data representing transform coefficients obtained by discrete cosign transform of picture data, is preferable.

A variable length code decoder according to another embodiment of the invention comprises:

a first decode table implemented with logic circuits for decoding each of certain of variable length codes encoded according to a coding system at one clock;

a second decode table implemented on a memory device for decoding variable length codes other than said certain of variable length codes making use of a tree searching technique;

a detecting means for discriminating whether a variable length code is any of said certain of variable length codes or not;

a first switching means for switching decoding procedure from the first decode table into the second decode table when the detecting means discriminate a variable length code to be decoded is not any of said certain of variable length codes; and a second switching means for switching the decoding procedure from the second decode table into the first decode table when the detecting means discriminates a variable length code to be decoded is one of said certain of variable length codes.

As to said certain of variable length codes, the zero-run codes representing run values of zero are preferable.

Therefore, compressed video data such as MPEG 2 data can be decoded with sufficient processing speed and a comparatively small memory space appropriate to be integrated on an IC chip. Furthermore, the VLC decoder of the invention can be used as it is also for decoding other compressed data such as MPEG 1 data, only by re-writing data of the memory decode table.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings:

FIG. 2 is a schematic diagram illustrating a configuration of the memory decode table 104 of FIG. 1;

FIG. 4 is a schematic diagram illustrating a configuration of the memory decode table 115 of FIG. 3;

FIG. 6 is a table chart illustrating data composition of the macroblock layer 75 and the block layer 76 of FIG. 5;

FIG. 7 is a table chart illustrating a part of the "zero-run" code used for the data FDC (First DCT Coefficient), SDC (Subsequent DCT Coefficients) and EOB (End of Block) of the block layer 76 of FIG. 6;

FIG. 8 is a table chart illustrating data composition of the block layer of MPEG 1 data;

FIG. 11 is a schematic diagram illustrating data prepared in the memory decode table 212 of FIG. 10;

FIG. 13 is a schematic diagram illustrating data prepared in the memory decode table 233 of FIG. 12;

FIG. 15 is a schematic diagram illustrating an example of the first or the second decode table 231 or 232 of FIG. 14;

FIG. 16 is a block diagram illustrating another conventional example of the programed type VLC decoder for decoding two codes at once;

FIG. 17 is a schematic diagram illustrating configuration of the first to the 17th decode table 242 to 258 of FIG. 16.

DETAILED DESCRIPTION OF THE PREFERRED EMBODIMENTS

Now, embodiments of the present invention will be described in connection with the drawings.

In the following paragraphs, the embodiments are described to be applied for decoding compressed video data which is encoded according to MPEG 2 standard developed by ISO/IEC JTC1/SC2/WG 8 Moving Picture Experts Group. However, the application of this invention is not limited to the MPEG 2 data. This invention is applicable for decoding any other encoded data wherein VLC data according to a coding system so called "zero-run code", such as standardized to be used for encoding TCOOEFF (Transform COEFFicients) of DCT (Discrete Cosign Transform), for example, are included, whereof a part is illustrated in a table chart of FIG. 7.

Figure 5:
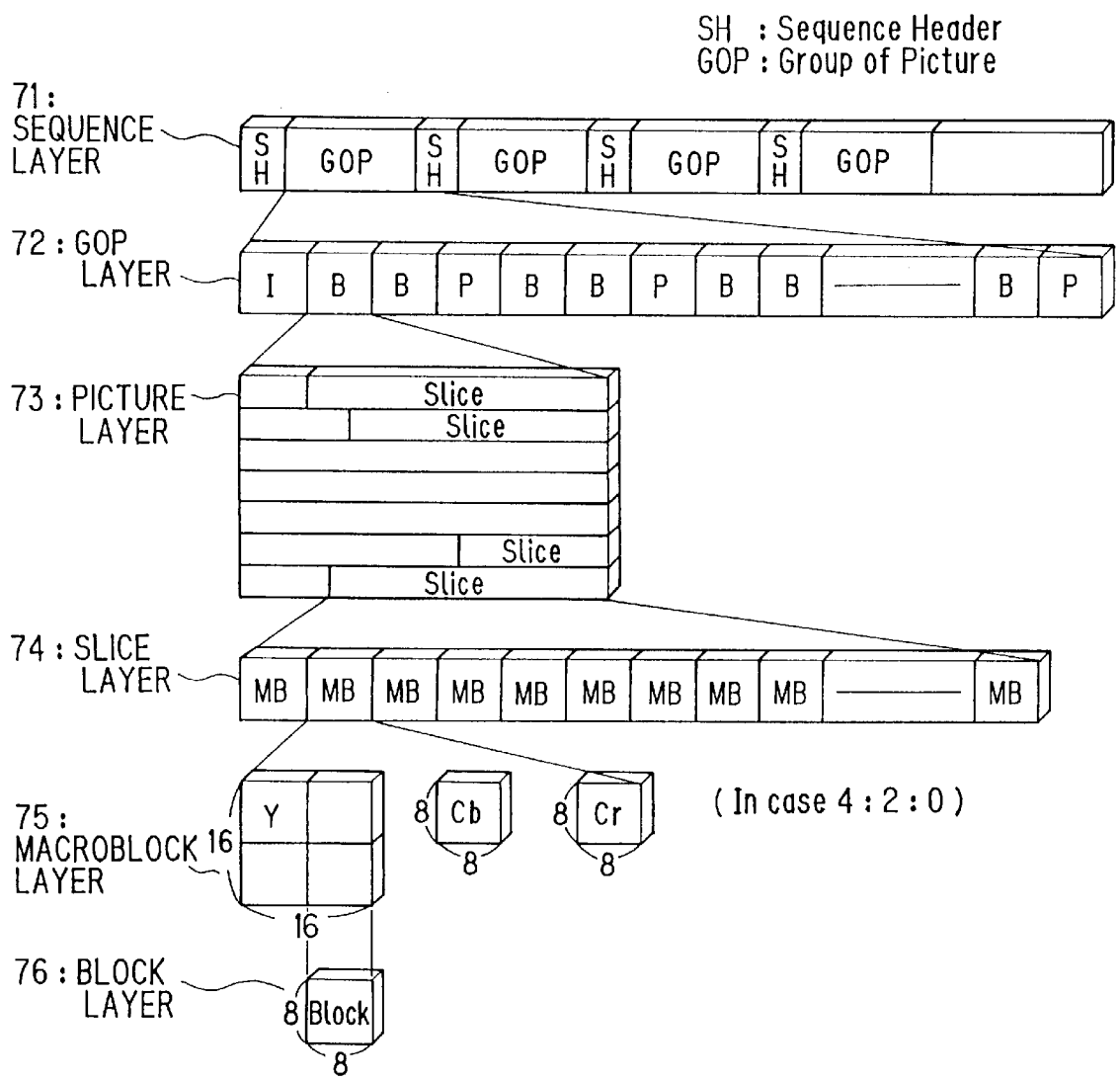
FIG. 5 is a schematic diagram illustrating the layer structure of the MPEG 2 data.
Figure 9:
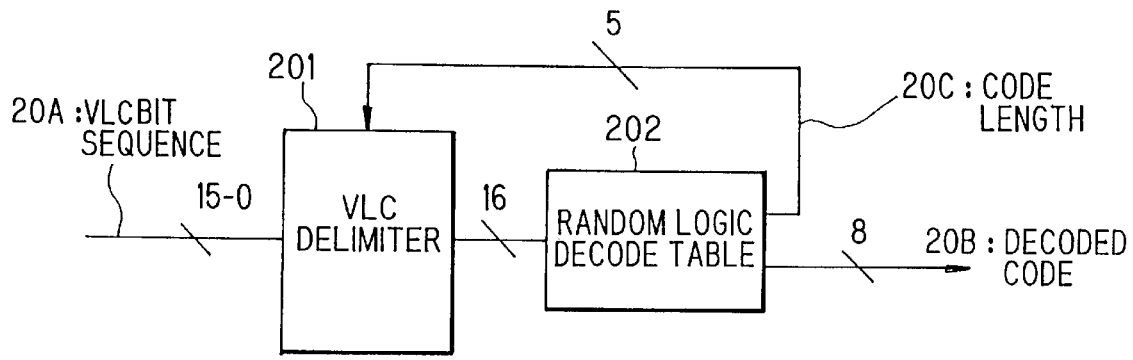
FIG. 9 is a block diagram illustrating a conventional example of a fixed hard type VLC decoder.
Figure 10:
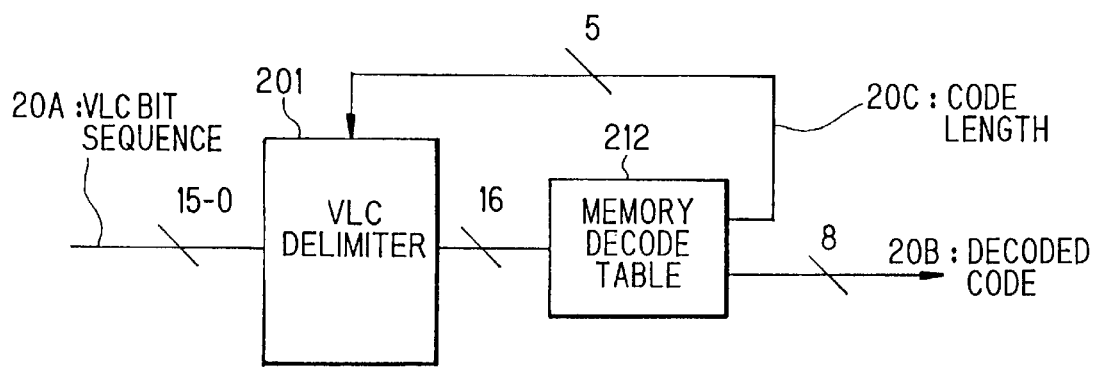
FIG. 10 is a block diagram illustrating a conventional example of a programmed type VLC decoder which decodes the VLC code by code.

FIG. 5 is a schematic diagram illustrating the layer structure of the MPEG 2 data, and FIG. 6 is a table chart illustrating data composition of the macroblock layer 75 and the block layer 76 of FIG. 5.

As shown in FIG. 6, the VLC is used for many kinds of data, whereof the zero-run code of FIG. 7 is used for the data FDC (First DCT Coefficient), SDC (Subsequent DCT Coefficients) and EOB (End Of Block) of the block layer 76. In the MPEG 1 standard, the zero-run code of FIG. 7 is used for the data DCN (DCT Coefficients Next) and EOB (End of Block) of FIG. 8 illustrating MPEG 1 data composition of its block layer. The SDC or the DCN, which are according to substantially the same coding system, is repeated many times for reproducing picture data in each block layer ending with the EOB, in both MPEG 1 and MPEG 2. Other VLC data are not necessarily the same in the MPEG 1 and MPEG 2.

Figure 12:
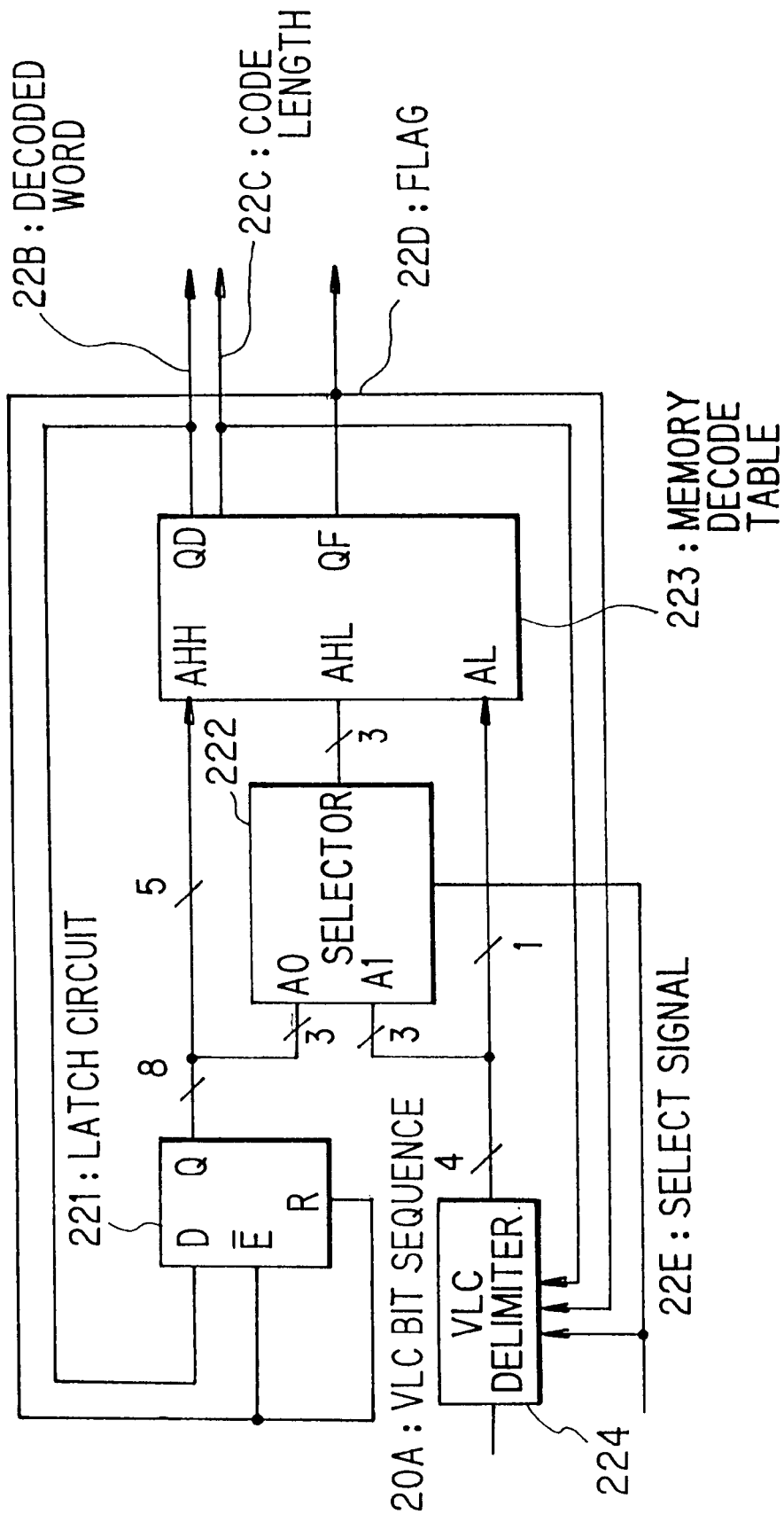
FIG. 12 is a block diagram illustrating another conventional example of the programed type VLC decoder for decoding the VLC code by code.
Figure 14:
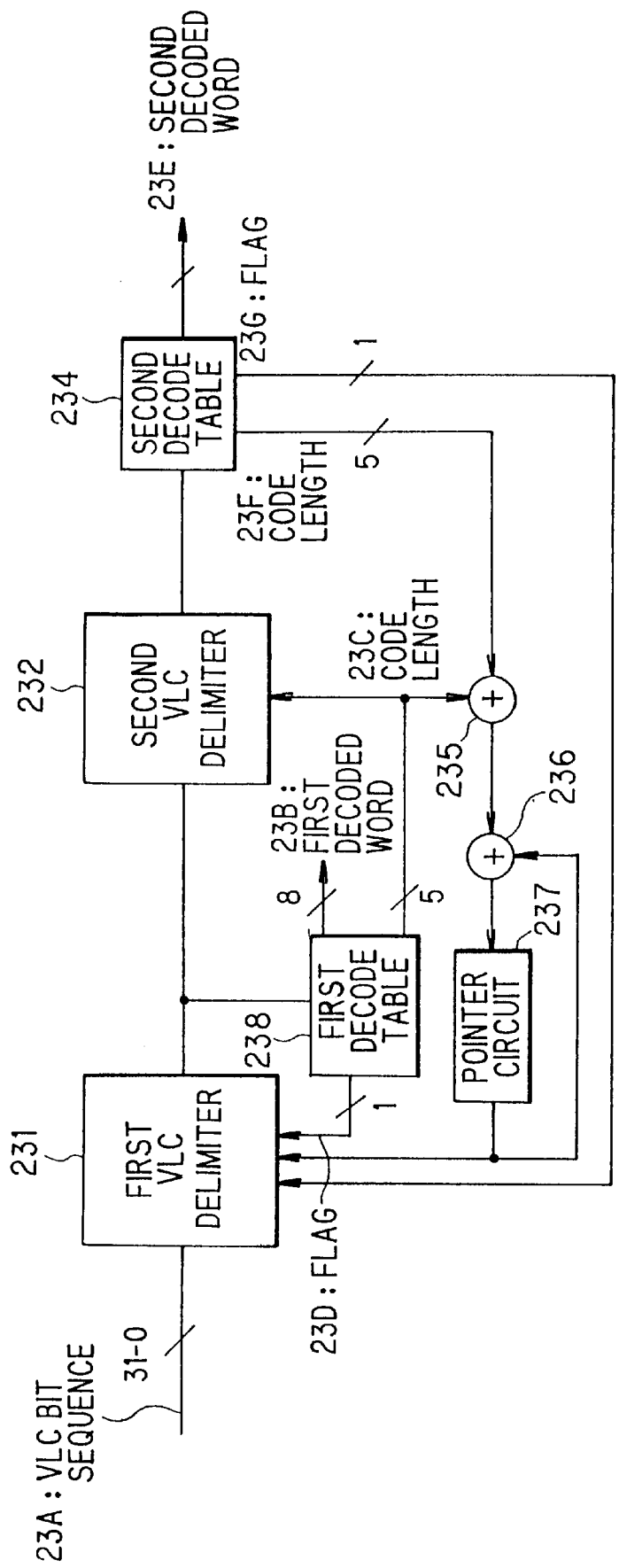
FIG. 14 is a block diagram illustrating another conventional example of the programed type VLC decoder for decoding the VLC by two codes at once.
Figure 18:
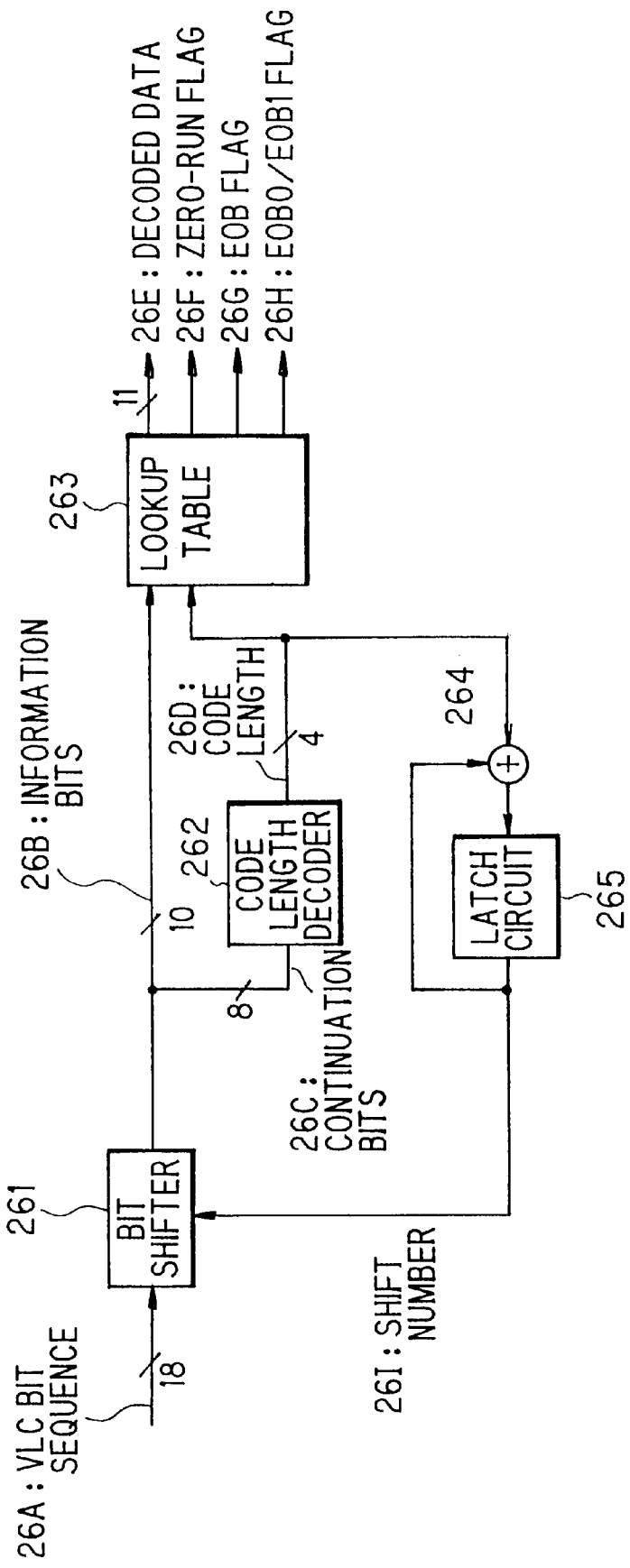
FIG. 18 is a block diagram illustrating still another example of a conventional VLC decoder to be applied for decoding so called B2-code.

In this invention, the commonly and mainly used VLC, such as the zero-run code, is decoded making use of a random logic decode table, and other VLC depending on each coding system is decoded with a memory decode table making use of the tree searching technique such as previously described in connection with FIG. 12.

With this conception, a VLC decoder having a wide adaptability and a sufficient average decoding speed can be realized with a circuit size appropriate to be integrated on an IC chip, according to the invention.

Figure 1:
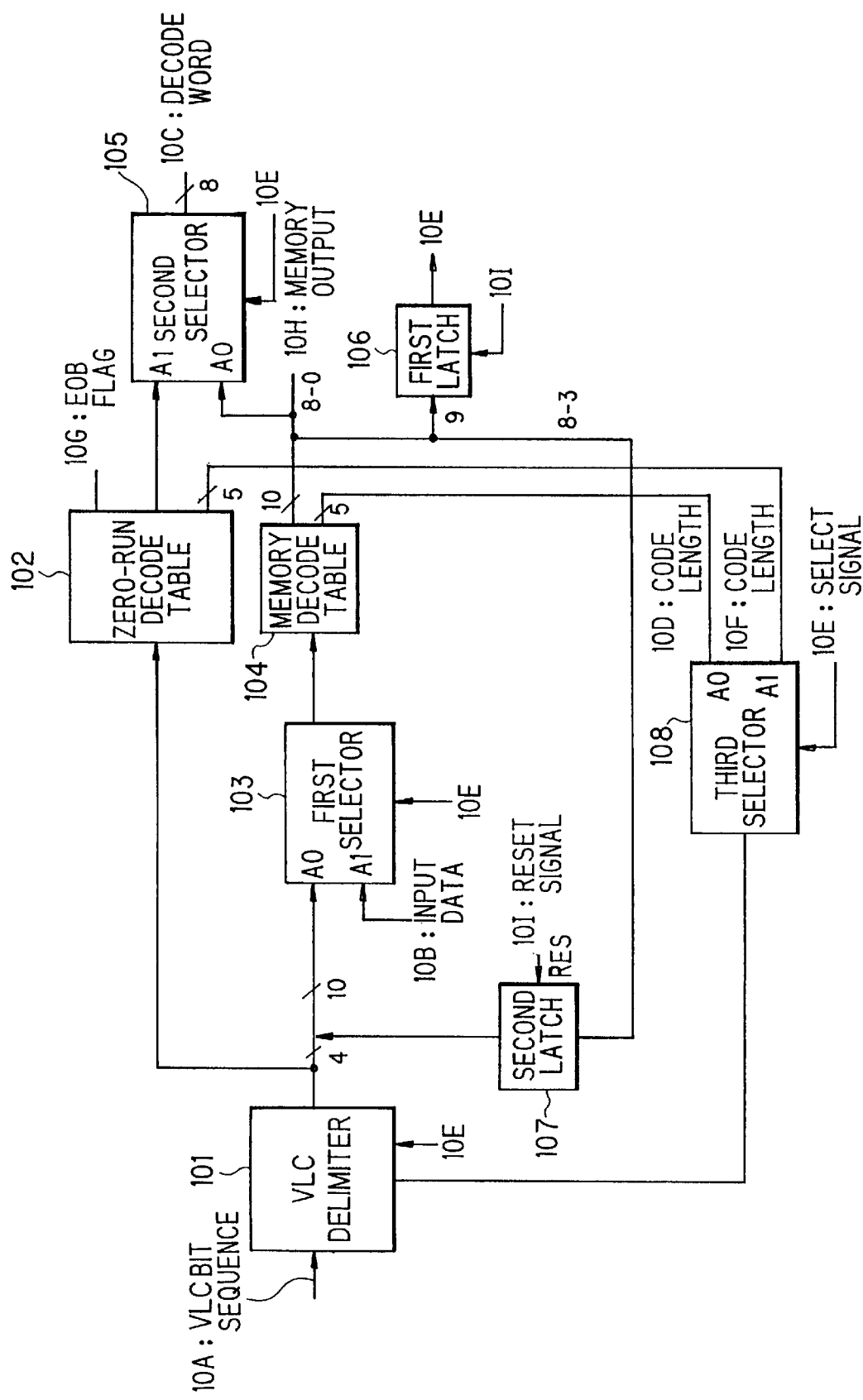
FIG. 1 is a block diagram illustrating a VLC decoder according to a first embodiment of the invention.

FIG. 1 is a block diagram illustrating a VLC decoder according to a first embodiment of the invention.

Referring to FIG. 1, the VLC decoder comprises;

a VLC delimiter 101 for delimiting a VLC bit sequence 10A, a zero-run decode table 102 having random logic circuits for decoding VLC data supplied from the VLC delimiter 101, a memory decode table 104, a first selector 103 for selecting either of the VLC data supplied from the VLC delimiter 101 together with pointer data or input data 10B supplied from outside, according to a select signal 10E, a second selector 105 for outputting a decoded word 10C by selecting either of output of the zero-run decode table 102 or lower eight bits (7–0) of output of the memory decode table 104 according to the select signal 10E, a third selector 108 for outputting a code length to be fed back to the VLC delimiter 101 by selecting either of a code length 10D obtained from the memory decode table 104 or a code length 10F obtained from the zero-run decode table 102, a first latch 106 for outputting the select signal 10E by latching the highest bit of the output of the memory decode table 104, and a second latch 107 for latching second to seventh higher six bits (8–3) of the output of the memory decode table 104.

FIG. 2 is a schematic diagram illustrating a configuration of the memory decode table 104, having a similar configuration to the memory decode table 223 of FIG. 13.

Higher six bits (9–4) of the address are used as the pointer address supplied from the second latch 107, and lower four bits (3–0) of the address are supplied from the VLC delimiter 103, both being selected by the first selector 103.

In each address which can identify a VLC code with a pointer followed by four VLC bits, data of a decoded word and a corresponding code length are stored together with flag data of higher two bits. In FIG. 2, length of data fields is depicted to be ten bits (9–0), schematically. However, necessary bit length for the data of a decoded word, a code length, and two flags is prepared in actual.

The highest bit represents a flag corresponding to the select signal 10E to be latched by the first latch 106. The highest bit of '1' indicates that the following VLC bit sequence 10A should be decoded by the zero-run decode table 102, while the highest bit of '0' indicates that the following VLC bit sequence 10A is to be analyzed and decoded by the memory decode table 104 continuously.

The second highest bit of '1' following the highest bit of '0' indicates that the stored data are the decoded word and the corresponding code length, while the second highest bit of '0' following the highest bit of '0' indicates that the stored data is the pointer data.

Among the data of decoded words, decoded values of DDD (DCT DC Differential) data of FIG. 6 are prepared in corresponding addresses. The highest bit is set to '1' in each data field of the DDD data.

Furthermore, in addresses not used for the VLC decoding, user's optional data may be stored in the memory decode table 104, such as illustrated in FIG. 2 by symbols '1MMM . . . '–'1NNN . . . ' and '1PPP . . . '–'1QQQ . . . '.

In the zero-run decode table 102, a decode table for decoding the zero-run code such as illustrated in FIG. 7 is implemented with random logic circuits. In FIG. 7, the value in 'level' column represents a DCT coefficient level of a frequency component, and the value in 'run' column represents a number of preceding frequency components of the DCT level=0. In the MPEG 2 system, the zero-run code, namely the FDC, the SDC and the EOB, begins following the DDD of FIG. 6, and ends with the EOB.

Now, operation of the embodiment of FIG. 1 is described.

Initially, the first and the second latch 106 and 107 is reset by a reset signal 10I. Therefore, the first latch 106 outputs the select signal 10E of '0', whereby the first, the second and the third selector 103, 105 and 108 are controlled to select the A0 side input, and the VLC delimiter 101 is controlled to the tree searching mode, that is, to output the VLC bit sequence 10A four bits by four bits at each clock.

Then, a VLC bit sequence 10A of MPEG 2 data, including various VLC data as illustrated in FIG. 6, are supplied.

The VLC delimiter 101 outputs four VLC bits, which are sent to the first selector 103 as lower four bits (3–0) of A0 input and to the zero-run decode table 102, at the same time. The second latch 107, which is reset by the reset signal 10I, outputs a pointer of '0000 00' to the first selector 103 as upper six bits (9–4) of the A0 side input.

The zero-run decode table 102 outputs some data corresponding to the four VLC bits, but the output data are ignored by the second selector 105 which is controlled to select A0 side input by the select signal 10E.

Selected by the first selector 103, the four VLC bits (3–0) and the pointer (9–4) are input to the memory decode table 104, which outputs the code length 10D and a decoded word or pointer data headed by flag data of two bits.

When a decoded word other than the DDD data is identified, the highest bit of the output of the memory decode table 104 becomes '0', which is latched by the first latch 106 and output as the select signal 10E for indicating to continue the VLC decoding by way of the memory decode table 104. Lower nine bits (8–0) of the memory decode table 104 are sent to the second selector 105, whereof lower eight bit (7–0) are selected by the second selector 105 to be output as the decoded word 10C, (on condition the ninth bit is not indicating the pointer data by '0'). The code length 10D is fed back to the VLC delimiter 101 selected by the third selector 108 to be used for determined the beginning bit of the following VLC bit sequence 10A. With the highest two bits of '01' of the output of the memory decode table 104, the reset signal 10I is also enabled and the second latch 107 is reset to '0000 00'.

When four VLC bits of '0101' is output of the VLC delimiter 101, by way of example, the address data (9–0) of '0000 0010 10' are supplied to the memory decode table 104. The memory decode table 104 outputs the decoded word of 'A' and the code length 10D of 4 headed by flag data of '01'. With the second highest bit '2' of the flag data, the reset signal 10I is enabled and resets the second latch 107. The code length 10D of 4 is fed back to the VLC delimiter 101 through the third selector 108.

Then, the beginning four bits '1101' of the next VLC bit sequence 10A of '1101 0001 01 . . . ' (beginning with a VLC corresponding to the decoded word of 'C') are supplied to the memory decode table 104 together with the pointer '0000 00' from the second latch 107 which is reset by the reset signal 10I. Thus, an address of '0000 0010 11' is input to the memory decode table 104. The memory decode table 104 outputs a pointer data or '0000 0100 0' following the flag bit of '0' (secong highest bit is treated as a part of the pointer data).

When the highest two bits of the output of the memory decode table 104 are '00', that is, when the memory decode table 104 cannot identify any VLC and outputs pointer data, the code length 10D of '0' is fed back to the VLC delimiter 101, and the four VLC bits analysis of the VLC is continued.

The reset signal 10I remaining disable, higher six bits (8–3) '0000 01' of the pointer data are latched by the second latch 107 and supplied as higher six bits (9–4) of the A0 side input of the first selector 103. The pointer (9–4) and the next four VLC bits (3–0) are supplied to the memory decode table 104 selected by the first selector 103. Thus, an address of '0000 0110 00' is input to the memory decode table 103, wherein another pointer data '0000 1000 0' is stored following the flag bits of '00'. Therefore, the four VLC bit analysis is performed again.

The next four VLC bits (3–1) of '01xx' are input to the memory decode table 104 together with the pointer (9–4) of '0000 10' output of the second latch 107 by latching (8–3) bits of the output of the memory decode table 104. Thus, the decoded word 10C of 'C' is obtained from the address '0000 10xx 10' of the memory decode table 104, and the code length 10D of 10 is fed back to the VLC delimiter 101.

By repeating above procedure, the VLC decoding of the MPEG 2 data is continued until one of the DDD (DCT DC Differential) data of FIG. 6 is decoded by the memory decode table 104.

When one of the DDD data is decoded by the memory decode table 104, the select signal 10E turns to '1', the highest bit of the output of the memory decode table 104 being latched by the first latch 106. Therefore, the first, the second and the third selector 103, 105 and 108 are controlled to select A1 side inputs, and the VLC delimiter 101 is controlled to output 24 bits at once, for example.

Hence, the VLC decoding is switched to be performed by way of the zero-run decode table 102. The output of the zero-run decode table 102 is selected by the second selector 105 to be out as the decoded word 10C. The code length 10F output of the zero-run decode table 102 is selected and fed back to the VLC delimiter 101 to be used for delimiting following VLC bit sequence 10A.

Thus, decoding by the zero-run decode table 102 is repeated for the zero-run code of FIG. 7 (FDC and SDC data of FIG. 6 following the DDD data) until the EOB code is decoded, since the select signal 10E latched by the first latch 105 remaining to be '1'.

During the VLC decoding is continued by way of the zero-run decode table 102, the first selector 103 is controlled to select the input data 10B supplied to the A1 input thereof. Therefore, some optional data may be supplied as the input data 10B for generating an interruption signal for a status transition or for generating a control signal of an arithmetic co-processor to be output as a memory output 10H, for example, such as illustrated in FIG. 2 by symbols '1MMM . . . '–'1NNN . . . ' and '1PPP . . . '–'1QQQ . . . '.

When the EOB data is detected by the zero-run decode table 102, an EOB flag 10G is output, which also enables the reset signal 10I. By the reset signal 10I, the first latch 106 is reset and the select signal 10E becomes '0', whereby the first, the second and the third selector 103, 105 and 107 are controlled to select A0 side inputs, and the VLC decoding begins to be performed by way of the memory decode table 104.

By repeating above procedures, MPEG 2 data are decoded with sufficient processing speed and a comparatively small memory space appropriate to be integrated on an IC chip. Furthermore, the VLC decoder of the embodiment can be used as it is also for decoding other compressed data such as MPEG 1 data, only by re-writing data of the memory decode table 104.

In the embodiment of FIG. 1, all zero-run codes are decoded by way of the zero-run decode table 102 configured with random logic circuits. However, decoding by way of a hard logic may be specialized in zero-run codes having high appearance frequency, for example.

Figure 3:
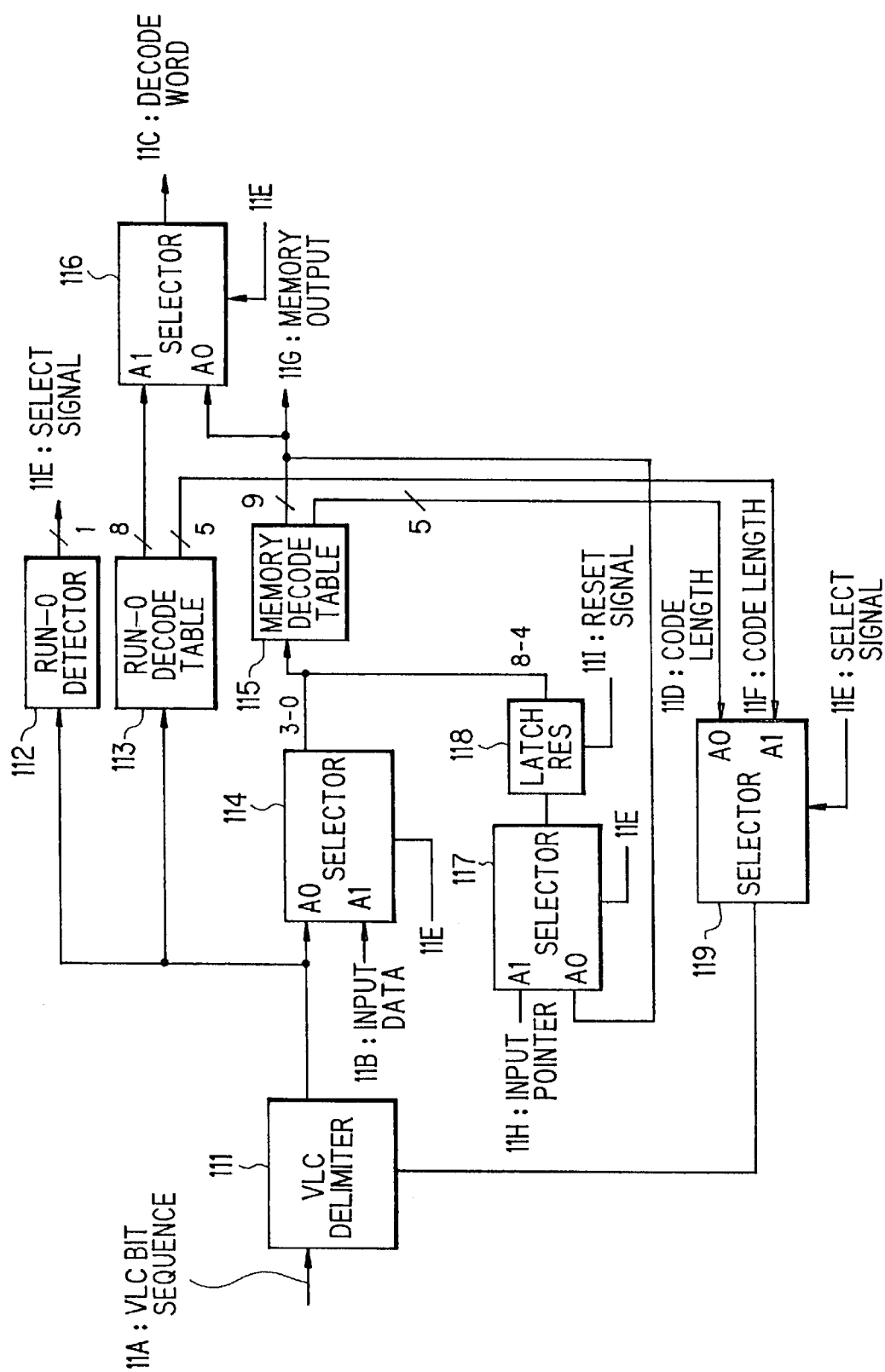
FIG. 3 is a block diagram illustrating a VLC decoder according to a second embodiment of the invention.

FIG. 3 is a block diagram illustrating a VLC decoder according to a second embodiment of the invention, wherein decoding by way of the hard logic is specialized into zero-run codes having the 'run' value of FIG. 7 equal '0' (hereafter called the "run-0 codes").

The VLC decoder of FIG. 3 comprises;

a VLC delimiter 111 for delimiting a VLC bit sequence 11A, a run-0 detector 112 for outputting a select signal 11E of '1' when VLC data delivered from the VLC delimiter 111 is a run-0 code, a run-0 decode table 113 having random logic circuits for decoding VLC data supplied from the VLC delimiter 111, a memory decode table 115, a first selector 114 for selecting either of lower four bits (3–0) of the VLC data supplied from the VLC delimiter 111 or input data 11B supplied from outside, according to a select signal 11E, a second selector 116 for outputting a decoded word 11C by selecting either of output of the run-0 decode table 113 or lower eight bits (7–0) of output of the memory decode table 115 according to the select signal 10E, a third selector 119 for outputting a code length to be fed back to the VLC delimiter 111 by selecting either of a code length 11D obtained from the memory decode table 115 or a code length 11F obtained from run-0 decode table 113, a four selector 117 for outputting either of an input pointer 11H supplied from outside or fourth to eight lower bits (8–4) of memory output 11G obtained from the memory decode table 115, and a latch 118 for outputting higher five bits (8–4) of the address of nine bits to be supplied to the memory decode table 115 by latching output of the fourth selector 117.

The select signal 11E having a default value of '0' is turned to '1' by the run-0 detector 112 when a run-0 code as above described is input, and the first to the fourth selector 114, 116, 119 and 117 are controlled to select A1 input when the select signal 11E is '1'.

In the run-0 decode table 113, a decode table for decoding the run-0 codes corresponding to data having 'run' values of '0' such as illustrated in second, third, fifth line, etc., of the table chart of FIG. 7 is implemented with random logic circuits.

FIG. 4 is a schematic diagram illustrating a configuration of the memory decode table 115, having a similar configuration to the memory decode table 104 of FIG. 2.

Higher five bits (8–4), in this example, of the address are used as the pointer address supplied from the latch 118, and lower four bits (3–0) of the address are supplied from the first selector 114.

In each address which can identify a VLC code with a pointer followed by four VLC bits, data of a decoded word and a corresponding code length are stored following a highest bit used for a flag indicating a pointer data. In FIG. 4, length of address fields and data fields are both depicted to be nine bits (8–0), schematically. However, necessary bit length for the address and the data of a decoded word, a code length, and a flag may be prepared according to VLC code to be decoded.

The highest bit of '1' indicates that the stored data are the decoded word and the corresponding code length, while the highest bit of '0' indicates that the stored data is the pointer data.

Furthermore, in addresses not used for the VLC decoding, user's optional data may be stored also in the memory decode table 115, such as illustrated in FIG. 4 by symbols 'SSSS STTT' and 'UUUU . . . '.

In the embodiment of FIG. 3, the VLC delimiter 111 is designed to output the VLC bit sequence 11A four bits by four bits at each clock to the first selector 114, on condition that the code length supplied form the third selector 119 is '0', and the VLC delimiter 111 also 24 bits to the run-0 detector 112 and the run-0 decode table 113 when a code length supplied from the third selector 119 is not '0' for indicating beginning bit of a following VLC code, also sending first four bits thereof to the first selector 114.

Now, operation of the embodiment of FIG. 3 is described.

Initially, the latch 118 is reset by a reset signal 11I and outputs a pointer '0000 0'. The run-0 detector 112 outputs the select signal 11E of the default value of '0', whereby the first to the fourth selector 114, 116, 119 and 117 are controlled to select the A0 side input.

Then, a VLC bit sequence 11A of MPEG 2 data, including various VLC data as illustrated in FIG. 6, are supplied.

The VLC delimiter 111 outputs four VLC bits, which are sent to the memory decode table 115 as lower four bits (3–0) of the address data selected by the first selector 114. The latch 117 outputs a pointer of '0000 0' to the memory decode table 115 as upper five bits (8–4) of the address data.

The run-0 decode table 113 outputs some data corresponding to the VLC bit sequence of 24 bits, but the output data are ignored by the second and the third selector 116 and 119, when the VLC bit sequence 11A does not begin with the run-0 code.

When a decoded word is identified, the highest bit of the output of the memory decode table 115 becomes '1'. Lower eight bits (7–0) are selected by the first selector 116 to be output as the decoded word 11C, (on condition the highest bit is not indicating the pointer data by '0'). The code length 11D is fed back to the VLC delimiter 111 selected by the third selector 119 to be used for determining the beginning bit of the following VLC bit sequence 11A. With the highest bit of '1' of the output of the memory decode table 115, the reset signal 11I is also enabled and output of the latch 118 is reset to '0000 0'.

When four VLC bits of '0101' is output of the VLC delimiter 111, by way of example, the address data (8–0) of '0000 0010 10' are supplied to the memory decode table 115. The memory decode table 115 outputs the decoded word of 'A' and the code length 11D of 4 headed by flag data of '1'. With the flag data of '2', the reset signal 11I is enabled and resets the latch 118. The code length 11D of 4 is fed back to the VLC delimiter 111 through the third selector 119.

Then, beginning four bits '1101' of the following VLC bit sequence 11A of '1101 0001 01 . . . ' (beginning with VLC of the decoded word of 'C') are supplied to the memory decode table 115, together with the pointer '0000 0' from the latch 118 which is reset by the reset signal 11I. Thus, an address '0000 0101 1' is input to the memory decode table 115. The memory decode table 115 outputs a pointer data of '0000 1000' following the flag bit of '0'.

When the flag bit is '0', that is, when the memory decode table 115 cannot identify any VLC and outputs pointer data, the code length 11D of '0' is fed back to the VLC delimiter 111 and the four bits VLC analysis of the VLC bit sequence 11A is continued.

The reset signal 11I remaining disable, higher five bits '0000 1' of the pointer data are selected by the fourth selector 117 and latched by the latch 118 to be supplied to the memory decode table 115 as higher five bits (8–4) of the nine bit address, together with the next four VLC bits (3–0) delivered from the VLC delimiter 111 and selected by the first selector 114. Thus, an address of '0000 1100 0' is input to the memory decode table 115, wherein another pointer data '0001 0000' is stored following the flag bit of '0'. Therefore, the four bit VLC analysis is continued again.

The next four VLC bits (3–1) of '01xx' are input to the memory decode table 104 together with the pointer (8–4) of '0001 0' output of the latch 118 by latching (8–3) bits of the output of the memory decode table 115. Thus, the decoded word 11C of 'C' is obtained from the address 0001 0xx1 0' of the memory decode table 115, and the code length 11D of 10 is fed back to the VLC delimiter 101.

By repeating above procedure, the VLC decoding of the MPEG 2 data is continued until one of the run-0 codes is detected by the run-0 detector 112.

When one of run-0 codes is detected by the run-0 detector 112, the select signal 11E is turned to '1'. Therefore, the first, the second, the third and the fourth selector 114, 116, 119 and 117 are controlled to select A1 inputs.

Hence, the VLC decoding is switched to be performed by way of the run-0 decode table 113. The output of the run-0 decode table 113 is selected by the second selector 116 to be output as the decoded word 11C. The code length 11F output of the run-0 decode table 113 is selected and fed back to the VLC delimiter 111 to be used for delimiting following VLC bit sequence 11A.

Thus, decoding by way of the run-0 decode table 113 is repeated during the run-0 codes continue.

During the VLC decoding is continued by way of the run-0 decode table 113, the first and the fourth selector 114 and 117 are controlled to select the input data 11B and the input pointer 11H supplied from outside. Therefore, any optional data may be supplied as the input data 11B together with input pointer 11H for generating an interruption signal for a status transition or for generating a control signal of an arithmetic co-processor to be output as a memory output 11G, for example, such as illustrated in FIG. 4 by symbols 'SSSS STTT T' and 'UUU . . . '.

When a VLC code other than the run-0 code is detected by the run-0 detector 112, the select signal 11E is turned to '0' and the decoding according to the tree searching technique by way of the memory decode table 115 begins again in the same way as beforehand described.

By repeating above procedures, MPEG 2 data are decoded and sufficient processing speed and a comparatively small memory space appropriate to be integrated on an IC chip, also in the embodiment of FIG. 3.

What is claimed is:

1. A variable length code decoder comprising:
a first decode table implemented with logic circuits for decoding each of variable length codes encoded according to a first coding system at one clock;
a second decode table implemented on a memory device for decoding variable length codes encoded according to other coding different than the first coding system making use of a tree searching technique;
a first switching means for switching decoding procedure from the first decode table into the second decode table when a first specific code is decoded by way of the first decode table, said first specific code indicating an end of a sequence of the variable length codes according to the first coding system; and
a second switching means for switching the decoding procedure from the second decode table into the first decode table when a second specific code is decoded by way of the second decode table, said second specific code indicating that a sequence of the variable length codes according to the first coding system is following.

2. A variable length code decoder as recited in claim 1; wherein said first coding system is a coding system standardized for coding data representing transform coefficients obtained by discrete cosine transform of picture data.

3. A variable length decoder as recited in claim 1; wherein optional data are stored in addresses of the second decode table not used for the decoding procedure, said optional data being output for performing a desired control process according to a corresponding address supplied to the second decode table when the decoding procedure is performed by way of the first decode table.

4. A variable length code decoder comprising:
a first decode table implemented with logic circuits for decoding each of certain of variable length codes encoded according to a coding system at one clock;
a second decode table implemented on a memory device for decoding variable length codes other than said certain of variable length codes making use of a tree searching technique;
a detecting means for discriminating whether a variable length code is any of said certain of variable length codes or not;
a first switching means for switching decoding procedure from the first decode table into the second decode table when the detecting means discriminates a variable length code to be decoded is not any of said certain of variable length codes; and
a second switching means for switching the decoding procedure from the second decode table into the first decode table when the detecting means discriminates a variable length code to be decoded is one of said certain of variable length codes.

5. A variable length code decoder as recited in claim 4, wherein:
said coding system is a coding system standardized for coding data representing transform coefficients obtained by discrete cosine transform of picture data; and
each of said certain of variable length codes is a code representing one of the transform coefficients which has a level other than zero and is not preceded by a transform coefficient of a zero level.

6. A variable length code decoder as recited in claim 4; wherein optional data are stored in addresses of the second decode table not used for the decoding procedure, said optional data being output for performing a desired control process according to a corresponding address supplied to the second decode table when the decoding procedure is performed by way of the first decode table.

* * * * *

UNITED STATES PATENT AND TRADEMARK OFFICE
CERTIFICATE OF CORRECTION

PATENT NO. : 6,069,575
DATED : May 30, 2000
INVENTOR(S) : Shingenori Kinouchi, Akira Sawada It is certified that error appears in the above-identified patent and that said Letters Patent is hereby corrected as shown below:

Column 6,
Line 36, delete "Th" insert -- The --

Column 9,
Line 23 delete "described" insert -- decoded --

Column 11,
Line 18, delete "233" insert -- 223 --

Column 13,
Line 52, delete "determined" insert -- determining --
Line 62, delete " '2'" insert -- '1' --

Column 14,
Line 46, delete "out" insert -- output --

Column 15,
Line 45, delete "eight" insert -- eighth --

Column 16,
Line 61, delete " '2' " insert -- '1' --

Column 17,
Line 10, delete "disable" insert -- disabled --

Column 18,
Line 7, after 1st occurrence of "coding" insert -- system --

Signed and Sealed this

Eighteenth Day of September, 2001

*Attest:*

NICHOLAS P. GODICI
*Attesting Officer*    *Acting Director of the United States Patent and Trademark Office*